(12) United States Patent
Chiou (10) Patent No.: US 7,590,925 B2
(45) Date of Patent: Sep. 15, 2009

(54) APPARATUS AND METHOD FOR DETECTING PUNCTURE POSITION IN A SYMBOL STREAM ENCODED BY PUNCTURED CONVOLUTIONAL CODING SCHEME

(75) Inventor: Rong-Liang Chiou, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 599 days.

(21) Appl. No.: 11/469,911

(22) Filed: Sep. 5, 2006

(65) Prior Publication Data

US 2008/0072124 A1    Mar. 20, 2008

(51) Int. Cl.
    *H03M 13/03* (2006.01)
(52) U.S. Cl. .................................................. 714/790
(58) Field of Classification Search ................ 714/746, 714/755, 786, 790
    See application file for complete search history.

(56) References Cited

U.S. PATENT DOCUMENTS 5,566,189 A * 10/1996 Laskowski .................. 714/746
5,790,566 A * 8/1998 Laskowski .................. 714/746
6,269,129 B1 * 7/2001 Rhee et al. .................. 375/341
7,065,696 B1 * 6/2006 Liu et al. ..................... 714/755
7,180,968 B2 * 2/2007 Miyauchi et al. ............ 375/341
2006/0274845 A1 * 12/2006 Chiang et al. ............... 375/261

* cited by examiner

*Primary Examiner*—Shelly A Chase
(74) *Attorney, Agent, or Firm*—Thomas, Kayden, Horstemeyer & Risley (57) ABSTRACT

An apparatus and method for determining a puncture position for a de-puncturing process. A stream of received symbols that corresponds to a code is received. A slicing unit slices the stream of received symbols to determine representative bits of the code to form a first bit stream. A delay line delays the first bit stream to generate a second bit stream. A convolutional decoder de-punctures and decodes the received symbol to generate a third bit stream. A puncture decision unit, coupled to the delay line and the convolutional decoder, selects the puncture position with one of possible puncture positions, and delivers the puncture position signal indicating the puncture position, and compares the second bit stream and the third bit stream to generate an error metric corresponding to the puncture position, and determines one of the possible puncture positions according to the error metric as a detected puncture position.

44 Claims, 6 Drawing Sheets

| SNR (dB) \ Bias | 0 | | 1 | | 2 | | 3 | | 4 | |
|---|---|---|---|---|---|---|---|---|---|---|
| \multicolumn{11}{c}{TCM Depuncture vs. Mismatched Decoded Bit over J.83B QAM64} |
| 19.78 | 5/60 | (6/120) | 6/60 | (14/120) | 7/60 | (13/120) | 5/60 | (10/120) | 4/60 | (14/120) |
| 20.78 | 2/60 | (4/120) | 7/60 | (11/120) | 7/60 | (12/120) | 4/60 | (10/120) | 7/60 | (16/120) |
| 21.78 | 2/60 | (4/120) | 8/60 | (12/120) | 6/60 | (10/120) | 3/60 | (9/120) | 8/60 | (15/120) |
| 22.78 | 0/60 | (1/120) | 6/60 | (12/120) | 4/60 | (11/120) | 5/60 | (12/120) | 4/60 | (9/120) |
| 23.78 | 0/60 | (0/120) | 3/60 | (9/120) | 3/60 | (9/120) | 5/60 | (11/120) | 4/60 | (9/120) |

APPARATUS AND METHOD FOR DETECTING PUNCTURE POSITION IN A SYMBOL STREAM ENCODED BY PUNCTURED CONVOLUTIONAL CODING SCHEME

BACKGROUND

The invention relates to communication of digital data using trellis coded modulation with punctured convolutional codes. In particular, the present invention relates to a depuncture technique employed in a receiver to process punctured conventional codes in digital communication systems.

Convolutional codes, used in channel coding, are widely utilized in many practical communication systems, with the main decoding strategy for convolutional codes based on Viterbi algorithm. In convolutional coding, a code rate is a ratio of the numbers of input bits to output bits. For example, a convolutional coder with code rate of 1/3 inputs one data bit and outputs three encoded bits, that is, two extra bits are added to protect the original data bit. Code puncturing is a way to intentionally discard some of the encoded bits so as to meet the constraints on data rate and bandwidth, although a few protection capability is sacrificed.

Figure 1:
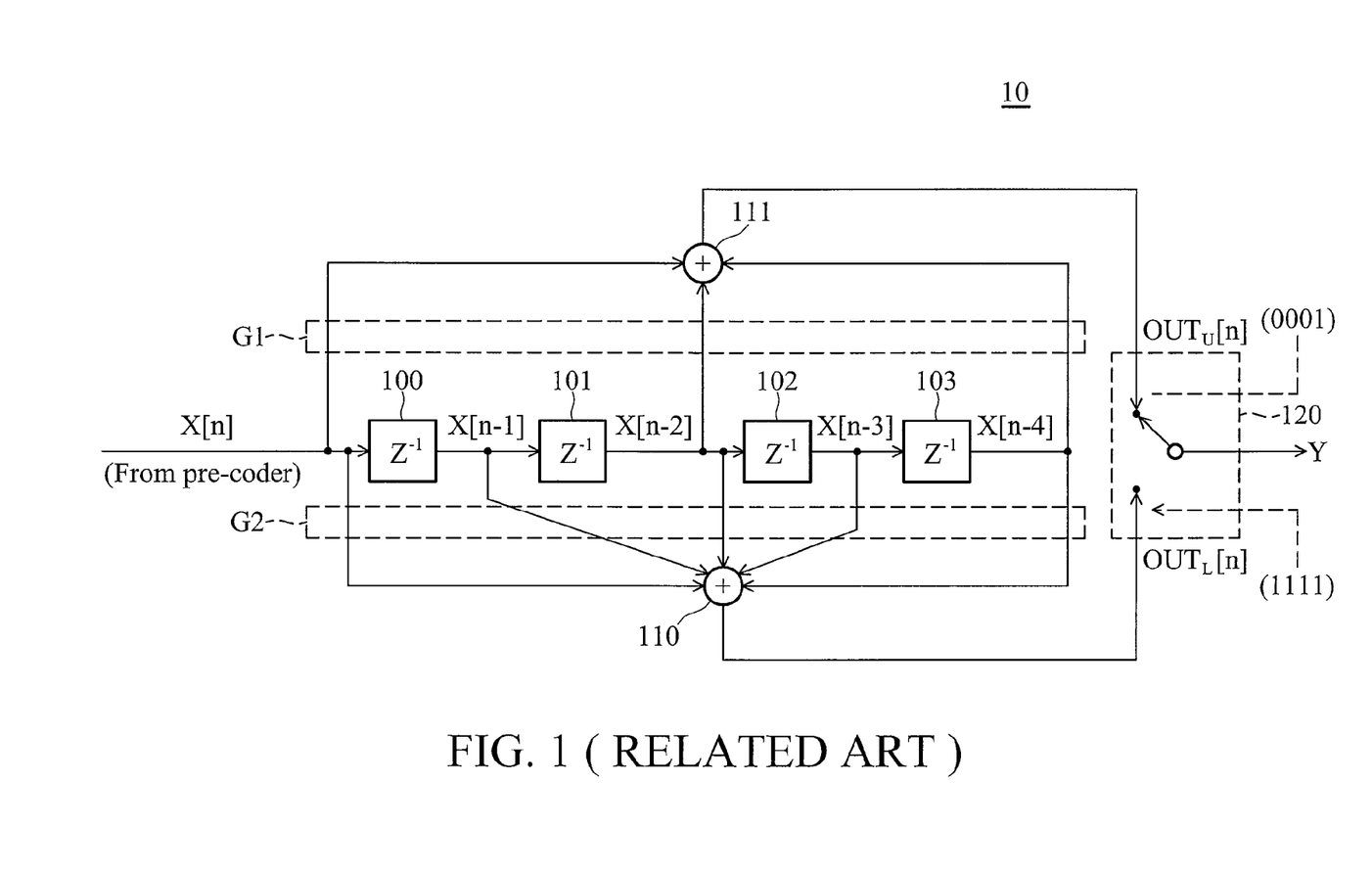
FIG. 1 (Related Art) is a block diagram of a convolutional coder using puncture codes complying with the standard of the ITU-T Recommendation J.83 Annex B.

FIG. 1 (Related Art) is a block diagram of a convolutional coder using puncture codes complying with the standard of the ITU-T Recommendation J.83 Annex B, in which the original code rate is 1/2 and the puncture code rate is 4/5. The convolutional coder 10 includes four registers 100, 101, 102 and 103, two exclusive-OR gates 110 and 111, and a commutator 120. The four registers 100-103 forms a delay line for delaying the input bits X[n] where n is the time index. To speak more specifically, the four registers 100-103 are used to store four previous input bits X[n−1], X[n−2], X[n−3] and X[n−4], which have 16 combinations and are used to define the state of the convolutional coder 10. As shown in FIG. 1, codes $OUT_U[n]$ and $OUT_L[n]$ are expressed by:

$$OUT_U[n]=X[n]\oplus X[n-2]\oplus X[n-4]; \quad (1)$$

$$OUT_L[n]=X[n]\oplus X[n-1]\oplus X[n-2]\oplus X[n-3]\oplus X[n-4] \quad (2)$$

Equations (1) and (2) are determined according to the generating codes G1 and G2, where G1=[10101] and G2=[11111]. It is noted that different convolutional coders will have different generating codes. Commutator 120 implements the puncture function using puncture matrix [P1;P2]=[0001;1111], where "0" indicates no transmission and "1" indicates transmission.

For each trellis group, the convolutional coder 10 can generate 8 convolutionally encoded bits from 4 input bits. The commutator 120 selects 5 bits from the 8 convolutionally encoded bits to be the output Y according to the puncture matrix. That is, code puncturing converts the code rate 1/2 to the code rate 4/5 since only 5 encoded bits are retained after puncturing.

Decoding the convolutional codes with puncture codes is easy if the convolutional coding and the puncture matrix are previously known. In some communication systems, such as ITU-T J.83B, however, it is necessary to directly ascertain the puncture boundary or puncture position from an incoming bit stream if there is no training sequence therein.

U.S. Pat. No. 6,233,712 discloses a 64/256 Quadrature Amplitude Modulation Trellis Coded Modulation (QAM TCM) decoder, capable of determining the puncture position. As disclosed therein, the decoder includes a depuncture circuit, a Viterbi decoder, a re-encode/puncture circuitry and a synchronization circuit. The incoming QAM signal stream is first demodulated into an in-phase component and a quadrature component. The depuncture 404 generates a depunctured in-phase component and a depunctured quadrature component using a puncture position for testing. The Viterbi decoder generates a decoded in-phase bit and a decoded quadrature bit for each pair of symbols. The re-encode/puncture circuitry performs binary convolutional encoding and puncturing on the decoded in-phase and quadrature bits to recover the incoming encoded symbols for testing. Conversely, the synchronization circuit performs hard decision based on the in-phase component and a quadrature component to generate hard symbols, and compares the hard symbols with the recovered encoded symbols for the reencode/puncture circuitry. If the puncture position for testing is accurate, the difference between the hard symbols and the recovered encoded symbols is minimal.

Accordingly, the method for detecting the puncture position adopted by U.S. Pat. No. 6,233,712 requires extra encode/puncture circuitry, increasing manufacturing costs and complicating product design.

SUMMARY

An embodiment of the invention provides an apparatus for determining a detected puncture position for a de-puncturing process. The apparatus comprises a slicing unit, a delay line, a convolutional decoder (such as Viterbi decoder) and a puncture decision unit. The slicing unit slices each of received symbols according to a hard decision rule to generate a first bit stream. The delay line delays the first bit stream to generate a second bit stream for a time period, which is used to synchronize between the second bit stream and the third bit stream from the convolutional decoder. The convolutional decoder receives a stream of the received symbols and performs the de-puncturing process and a decoding process to generate a third bit stream. The de-puncturing process is performed according to a puncture position indicated by a puncture position signal, and the decoding process is performed to generate a decoded information bitstream according to a surviving path maintained by the convolutional decoder. The puncture decision unit, coupled to the delay line and the convolutional decoder, generates the puncture position signal to indicate the puncture position, in which the puncture position is one of possible puncture positions. More specifically, the puncture decision unit compares the second bit stream and the third bit stream to generate an error metric corresponding to the puncture position, and then determines the detected puncture position by selecting one of the possible puncture positions according to the error metric corresponding to possible puncture positions.

Another embodiment of the invention provides a method for determining a detected puncture position for a de-puncturing process. First, a puncture position signal is generated to indicate a puncture position, which is one of possible puncture positions. Then each of received symbols is sliced to generate a first bit stream according to a hard decision rule. The first bit stream is delayed for a time period to generate a second bit stream. A de-puncturing process and a decoding process are performed to generate a third bit stream from a stream of the received symbols. The de-puncturing process is performed according to the puncture position indicated by the puncture position signal, and the decoding process is performed to generate a decoded information bitstream by maintaining a surviving path according to a convolutional decoding. Then the second bit stream is compared with the third bit stream to generate an error metric corresponding to the puncture position. The detected puncture position is determined by selecting one of the possible puncture positions according to the error metrics corresponding to possible puncture positions.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION

A preferred embodiment of the invention is demonstrated herein, which is not intended to limit the scope of the invention. In the preferred embodiment, a receiver for the standard recommended by ITU-T (International Telecommunication Union) Recommendation J.83 using 64-QAM/TCM encoding/decoding is illustrated, which is not intended to limit the scope of the invention. For example, the J.83B using 256-QAM/TCM encoding/decoding can be implemented according to the principles of the preferred embodiment.

Figure 2:
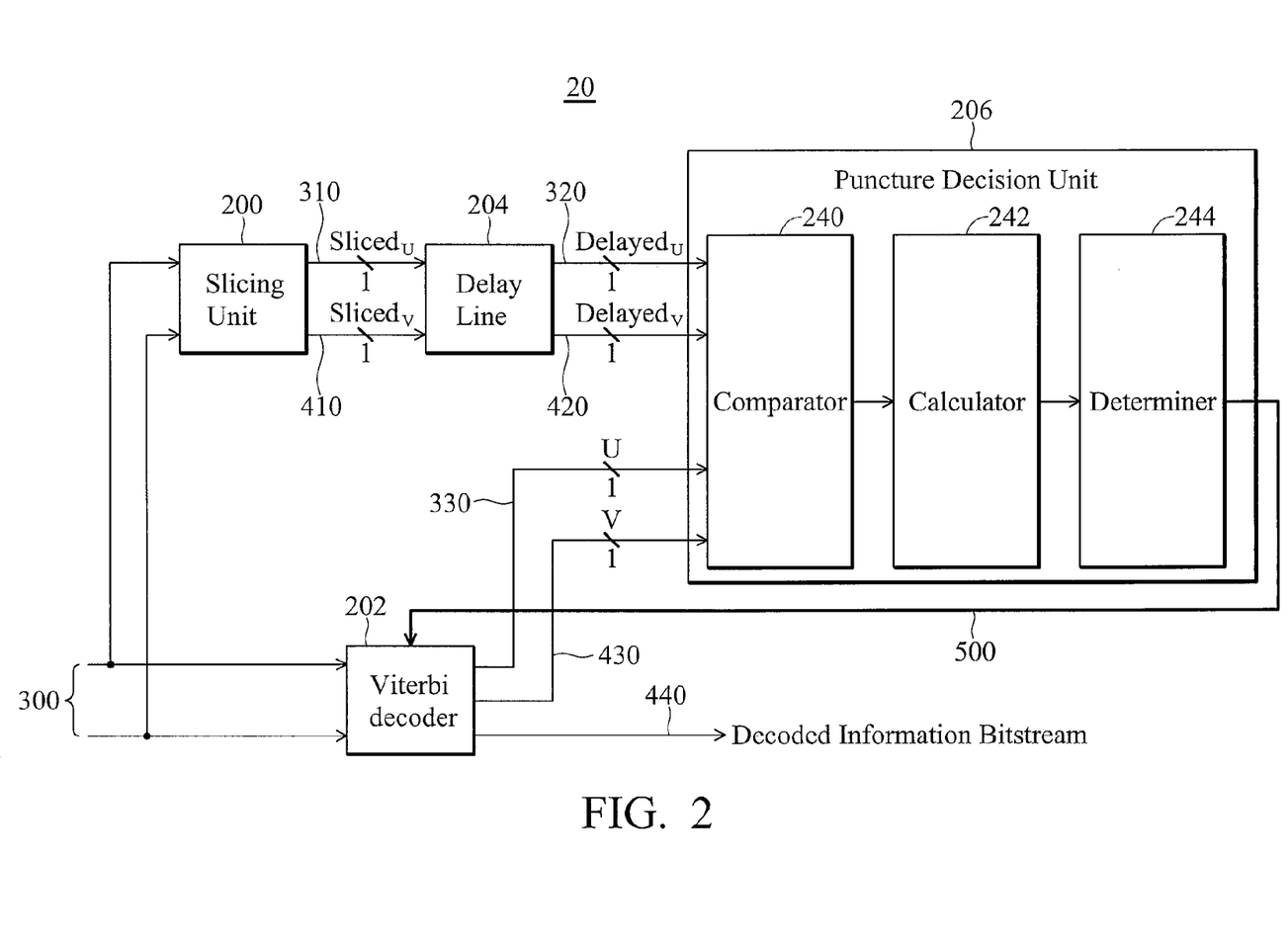
FIG. 2 is a block diagram of a trellis coded modulation decoder with depuncture in accordance with the preferred embodiment.

FIG. 2 is a block diagram of a trellis coded modulation decoder with depuncture in accordance with the preferred embodiment. As shown in FIG. 2, the trellis coded modulation decoder with depuncture 20 includes a slicing unit 200, a Viterbi decoder 202, a delay line 204 and a puncture decision unit 206. The received symbol 300 of this example is composed of an in-phase component and a quadrature component, which is de-modulated result of a communication signal according to a modulation scheme. The communication signal is demodulated by some previous stages (not shown) such as a QAM demodulator, then feed the received symbol into the trellis coded modulation decoder with depuncture 20. The slicing unit 200 slices the received symbol 300 according to a hard decision procedure to form a first bit stream including a U bits stream 310 and a V bits stream 410. After that, the U bits stream 310 and the V bits stream 410 are delayed by the delay line 204 to generate a second bit stream including a delayed U bits stream 320 and a delayed V bits stream 420. Moreover, the received symbol 300 is also fed into the Viterbi decoder 202. The Viterbi decoder 202 referring to the puncture position indicated by a puncture position signal 500, de-punctures and decodes the received symbol 300 to generate a decoded code, and a decoded information bitstream 440. Representative bits of the decoded code are extracted and concatenated to form a third bit stream including a decoded U bits stream 330 and a decoded V bits stream 430. The puncture decision unit 206 compares the delayed U bits stream 320 and the delayed V bits stream 420 with the decoded U bits stream 330 and the decoded V bits stream 430, respectively, and generates an error metric corresponding to the puncture position indicated by the puncture position signal. The puncture decision unit 206 examines possible puncture positions by delivering the puncture position signal 500 indicating the possible puncture positions. Until possible puncture positions are all examined, the puncture decision unit 206 determines the puncture position having lowest error metric as a detected puncture position and delivers its corresponding puncture position signal 500 to enable the normal operation of the Viterbi decoder 202. In this embodiment, the slicing unit 200 and the puncture decision circuit 206 can be implemented by software programs or hardware circuits.

Detailed operations of these functional blocks are described in detail as follows.

Figure 3:
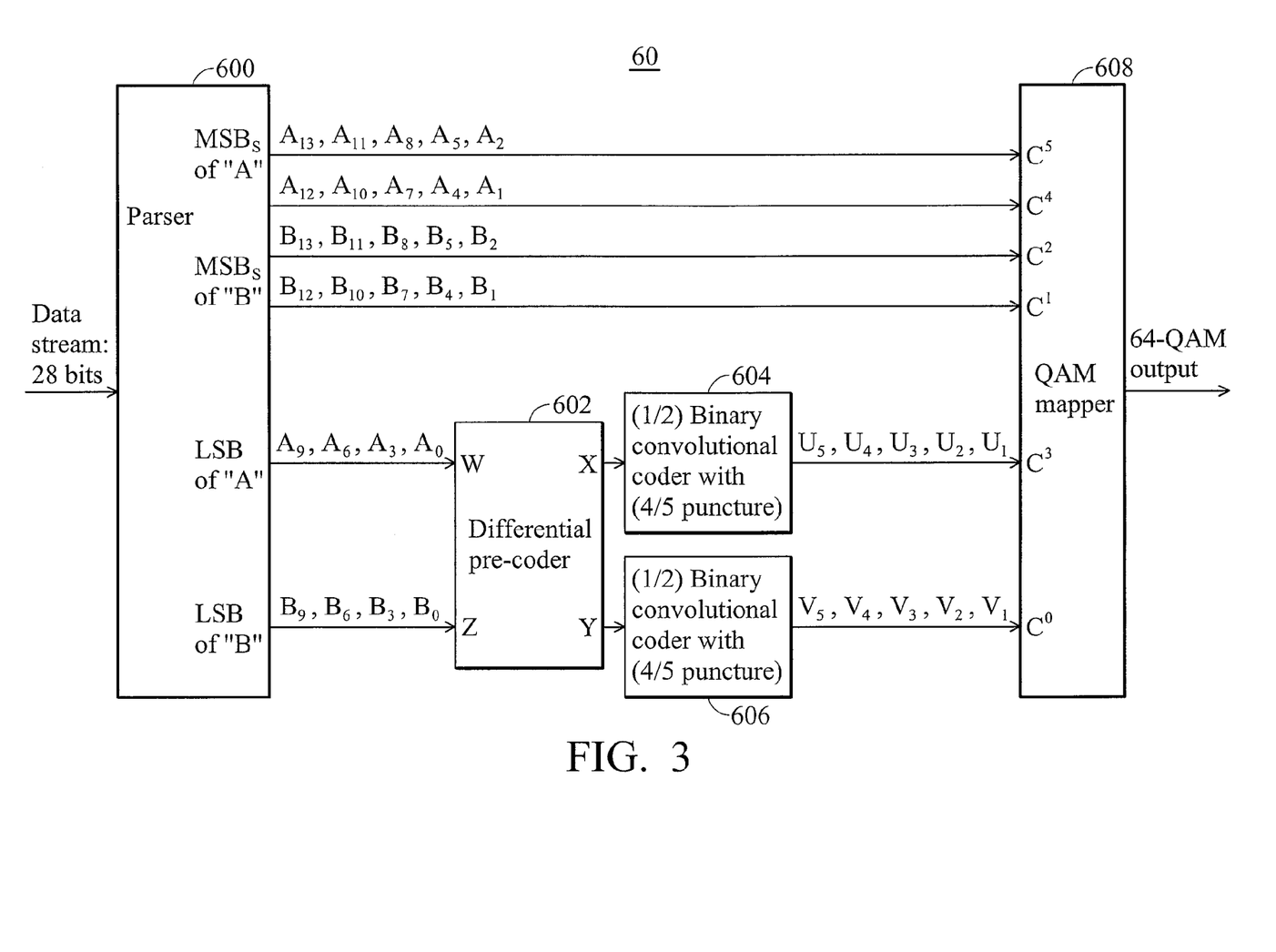
FIG. 3 is a block diagram of a TCM encoder complying with the J.83B 64-QAM TCM specification.

The received symbol 300 corresponds to a 6 bits code as $C^5C^4C^3C^2C^1C^0$. The slicing unit 200 slices the received symbol 300 to determine the $C^3$ and $C^0$ to respectively generate the U bits stream 310 and the V bits stream 410 of the first bitstream. FIG. 3 is a block diagram of a TCM encoder complying with the J.83B 64-QAM TCM specification. The TCM encoder 60 encodes a 28-bit data stream and generates into five consecutive 64-QAM symbols for mapping into five consecutive 64 QAM signals. A parser 600 identifies a group of four 7-bit symbols as an in-phase "A" component and a quadrature "B" component. The QAM mapper 608 receives code $C^5C^4C^3C^2C^1C^0$ to perform the QAM mapping function. As illustrated in FIG. 3, only information bits $C^3$ and $C^0$ are processed by differential pre-coder 602 and 1/2 binary convolutional coders with 4/5 puncture 604 and 606. Thus, bits $C^3$ and $C^0$ are encoded codes and bits $C^5$, $C^4$, $C^2$ and $C^1$ are un-encoded codes.

Figure 4:
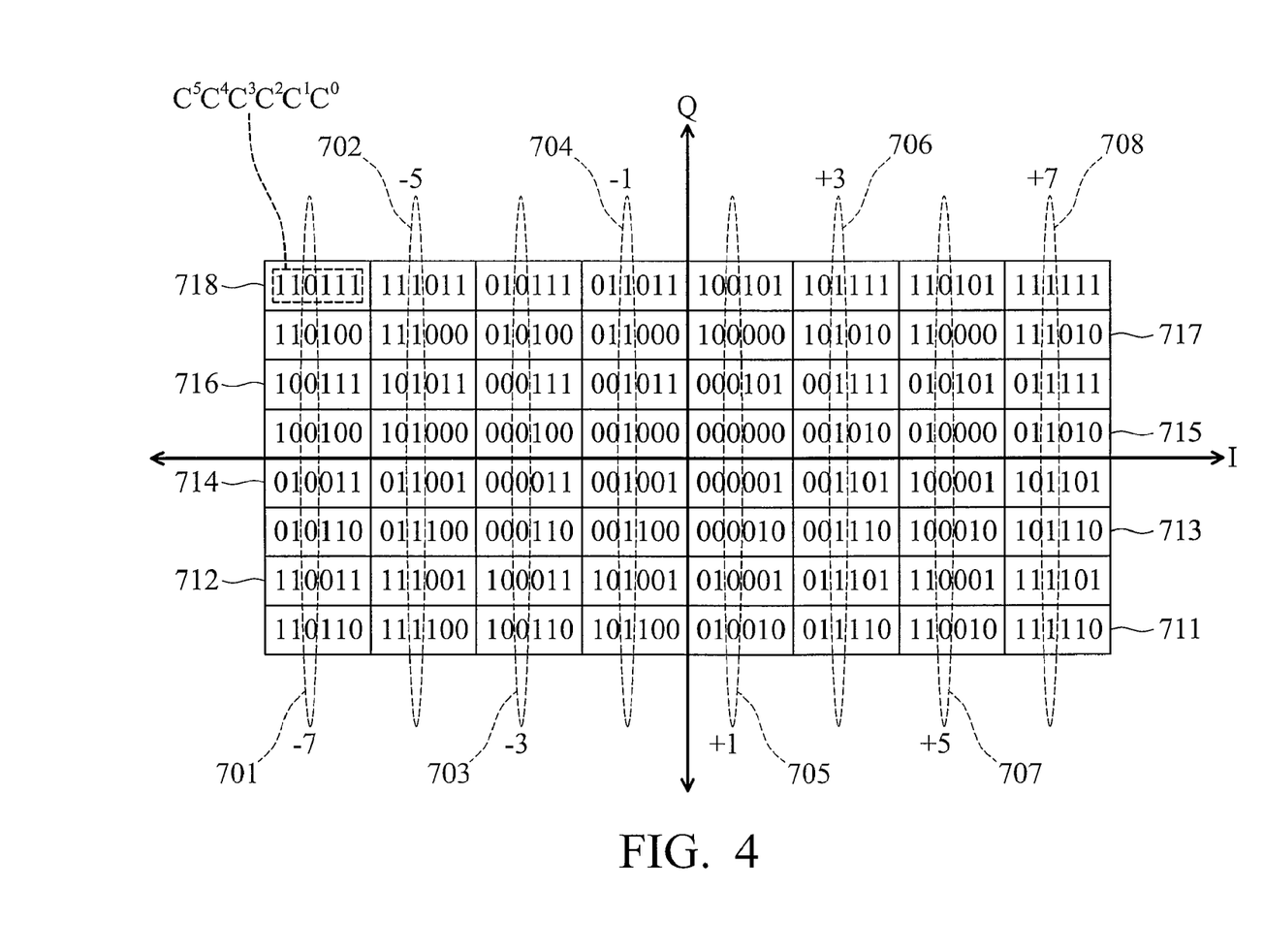
FIG. 4 is a constellation diagram of a QAM mapper 608 complying with the J.83B 64-QAM TCM specification.

FIG. 4 is a constellation diagram of a QAM mapper 608 complying with the J.83B 64-QAM TCM specification, which is used to determine the $C^3$ bit and $C^0$ bit of the 6 bits code of $C^5C^4C^3C^2C^1C^0$ according to the in-phase component and the quadrature component of the received symbol 300. According to FIG. 4, the relation between the received symbol 300 and the $C^3$ bit and $C^0$ bit can be expressed as follows. If the in-phase component of the received symbol 300 falls within the regions of 701, 703, 705, 707, which is closer to values of {−7, −3, +1, +5} rather than values of {−5, −1, +3, +7}, the $C^3$ bit is determined as "0". If the in-phase component of the QAM amplitude signal 300 falls within the regions of 702, 704, 706, 708, which is closer to values of {−5, −1, +3, +7} rather than values of {−7, −3, +1, +5}, the $C^3$ bit is determined as "1". In addition, the relation between quadrature component of the received symbol 300 and the $C^0$ bit can also be expressed as follows. If the quadrature component of the received symbol 300 falls within regions of 711, 713, 715, 717, which is closer to values of {−7, −3, +1, +5} rather than values of {−5, −1, +3, +7}, the $C^0$ bit is determined as "0". If the quadrature component of the received symbol 300 falls within the regions of 712, 714, 716, 718, which is closer to values of {−5, −1, +3, +7} rather than values of {−7, −3, +1, +5}, the bit $C^0$ is determined as "1".

According to the properties of the TCM encoder mentioned above, the decision rule employed in the slicing unit 200 is expressed as follows. In a practical communication environment, the received symbol are always affected by random noise and the amplitude cannot be maintained as the ideal values.

(Rule-1) One U bit of the sliced U bits stream 310 is determined as "1" if the corresponding in-phase component of the received symbol 300 falls within a bit 1 region for the U bit. In the preferred embodiment, the bit 1 region for the U bit is regions 702, 704, 706, 708, which the in-phase component of the received symbol within the bit 1 region is closer to values of {−5, −1, +3, +7} rather than values of {−7, −3, +1, +5}. The U bit is determined as "0" if the corresponding in-phase component of the received symbol 300 falls within a bit 0 region for the U bit. In the preferred embodiment, the bit 0 region for the U bit is regions 701, 703, 705, 707, which the in-phase component of the received symbol within the bit 0 region is closer to values of {−7, −3, +1, +5} rather than values of {−5, −1, +3, +7}.

(Rule-2) One V bit of the sliced V bits stream 410 is determined as "1" if the corresponding quadrature component of the received symbol 300 falls within a bit 1 region for the V bit. In the preferred embodiment, the bit 1 region for the V bit is regions 712, 714, 716, 718, which the quadrature component of the received symbol within the bit 1 region is closer to values of {−5, −1, +3, +7} rather than values of {−7, −3, +1, +5}. The V bit is determined as "0" if the corresponding quadrature component of the received symbol 300 falls within a bit 0 region for the V bit. In the preferred embodiment, the bit 0 region for the V bit is regions 711, 713, 715, 717, which the quadrature component of the received symbol within the bit 0 region is closer to values of {−7, −3, +1, +5} rather than values of {−5, −1, +3, +7}.

In one another embodiment of the present invention, the received symbol 300 complies with a 256-QAM modulation scheme and corresponds to a 8 bits code as $C^7C^6C^5C^4C^3C^2C^1C^0$. Then, the slicing unit 200 slices the received symbol 300 to determine the $C^4$ and $C^0$ bits to respectively generate the U bits stream 310 and the V bits stream 410 of the first bitstream. The in-phase component of the received symbol within the bit 1 region for the U bit is closer to values of {−13, −9, −5, −1, +3, +7, +11, +15} rather than values of {−15, −11, −7, −3, +1, +5, +9, +13}. The in-phase component of the received symbol within the bit 0 region is closer to values of {−15, −11, −7, −3, +1, +5, +9, +13} rather than values of {−13, −9, −5, −1, +3, +7, +11, +15}. The quadrature component of the received symbol within the bit 1 region for the V bit is closer to values of {−13, −9, −5, −1, +3, +7, +11, +15} rather than values of {−15, −11, −7, −3, +1, +5, +9, +13}. The quadrature component of the received symbol within the bit 0 region for the V bit is closer to values of {−15, −11, −7, −3, +1, +5, +9, +13} rather than values of {−13, −9, −5, −1, +3, +7, +11, +15}.

The delay line 204 is used to delay the sliced U bits stream 310 and the sliced V bits stream 410 for a time period and to generate the delayed U bits stream 320 and the delayed V bits stream 420. The delay time period is provided to synchronize between the delayed U and V bits streams and the decoded U and V bit streams, the decoded U and V bits stream is output by the Viterbi decoder which requires the time period to perform a Viterbi decoding.

The Viterbi decoder 202 de-punctures the received symbol 300 according to the puncture position indicated by the puncture position signal 500, and decodes by maintaining a surviving path based on a maximum likelihood estimation. Once the surviving path is found, the stream of decoded code (not shown) and the decoded information bits 440 are generated according to the surviving path, each decoded code corresponding to a constellation point of a modulation scheme of the received symbol. Base on the stream of decoded code, bits are extracted and concatenated to form the decoded U bits and decoded V bits. In one preferred embodiment, each decoded code containing 6 bits as $D^5D^4D^3D^2D^1D^0$, bit $D^3$ is extracted and concatenated as the decoded U bits stream 330, and bit $D^0$ is extracted and concatenated as the decoded V bits stream 430, respectively. The puncture decision unit 206 is used to determine a puncture position by consecutively examining possible puncture positions. In one preferred embodiment, there are five possible puncture positions, denoted as position 0, position 1, position 2, position 3 and position 4, respectively. The puncture decision unit 206 consecutively delivers the puncture position signal 500 indicating possible puncture positions as position 0, position 1, position 2, position 3 and position 4, to the Viterbi decoder 202. Then the puncture decision unit 206 compares the delayed U bits stream 320 and delayed V bits stream 420 with the decoded U bits streams 330 and decoded V bits stream 430 respectively, to find mismatching bits there between. In the preferred embodiment, an error metric is defined as a ratio of the number of mismatch bits to the number of total bits. After calculation of error metrics corresponding to possible puncture positions, the puncture decision unit 206 determines one of the possible puncture positions as the detected puncture position. As shown in FIG. 2, the puncture decision unit 206 includes a comparator 240, a calculator 242 and a determiner 244. The comparator 240 is used to compare the delayed U and V bits stream and the decoded U and V bits stream, respectively, to have a comparison result. The calculator 242 is used to receive the comparison result to calculate the error metrics corresponding to possible puncture positions. The determiner 244 determines one of the possible puncture positions corresponding to a lowest error metric as the detected puncture position.

Figure 5:
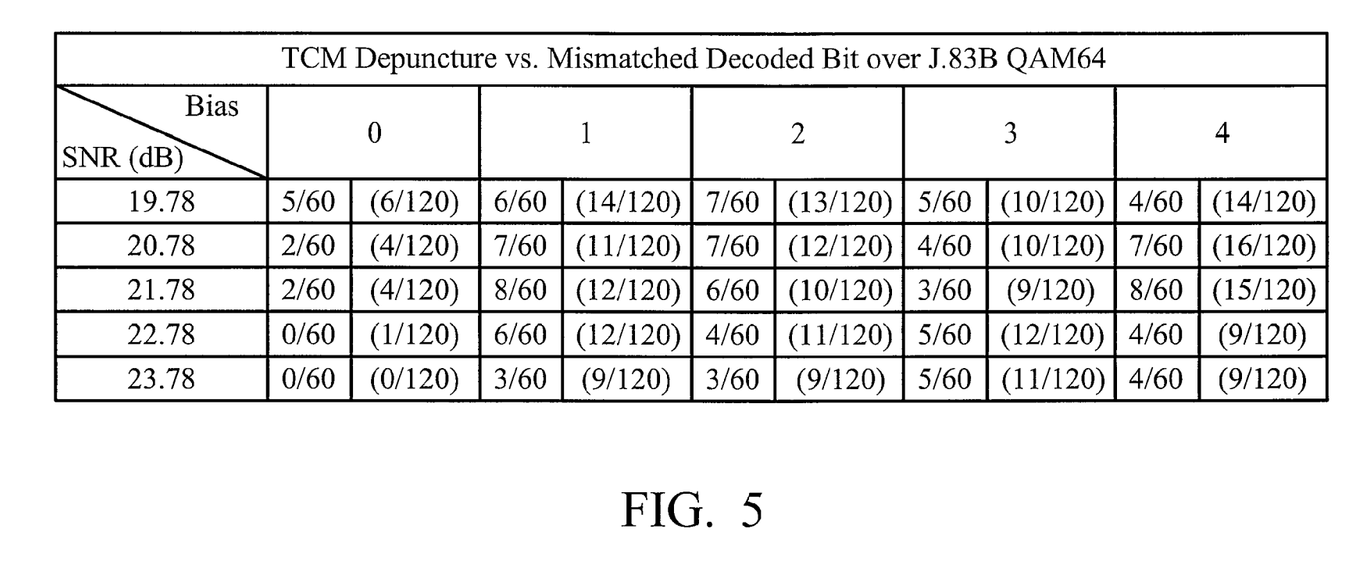
FIG. 5 is a table illustrating an example of error metrics with respect to the different puncture positions (Biases) and the environment signal-to-noise ratios (SNRs) over the J.83B 64-QAM specification.

FIG. 5 is a table illustrating an example of the error metrics with respect to the all possible puncture positions and the environment signal-to-noise ratios (SNRs) over the J.83B 64-QAM specification. In the table, there are two error metrics for each case corresponding to different symbol sequence lengths, 60 and 120. In this example, it is apparent that the puncture position corresponding to position 0 has the lowest error metrics and can be selected as the detected puncture position. In addition, the environment SNR and the symbol sequence length can affect the discrimination of the error metrics between different cases.

Figure 6:
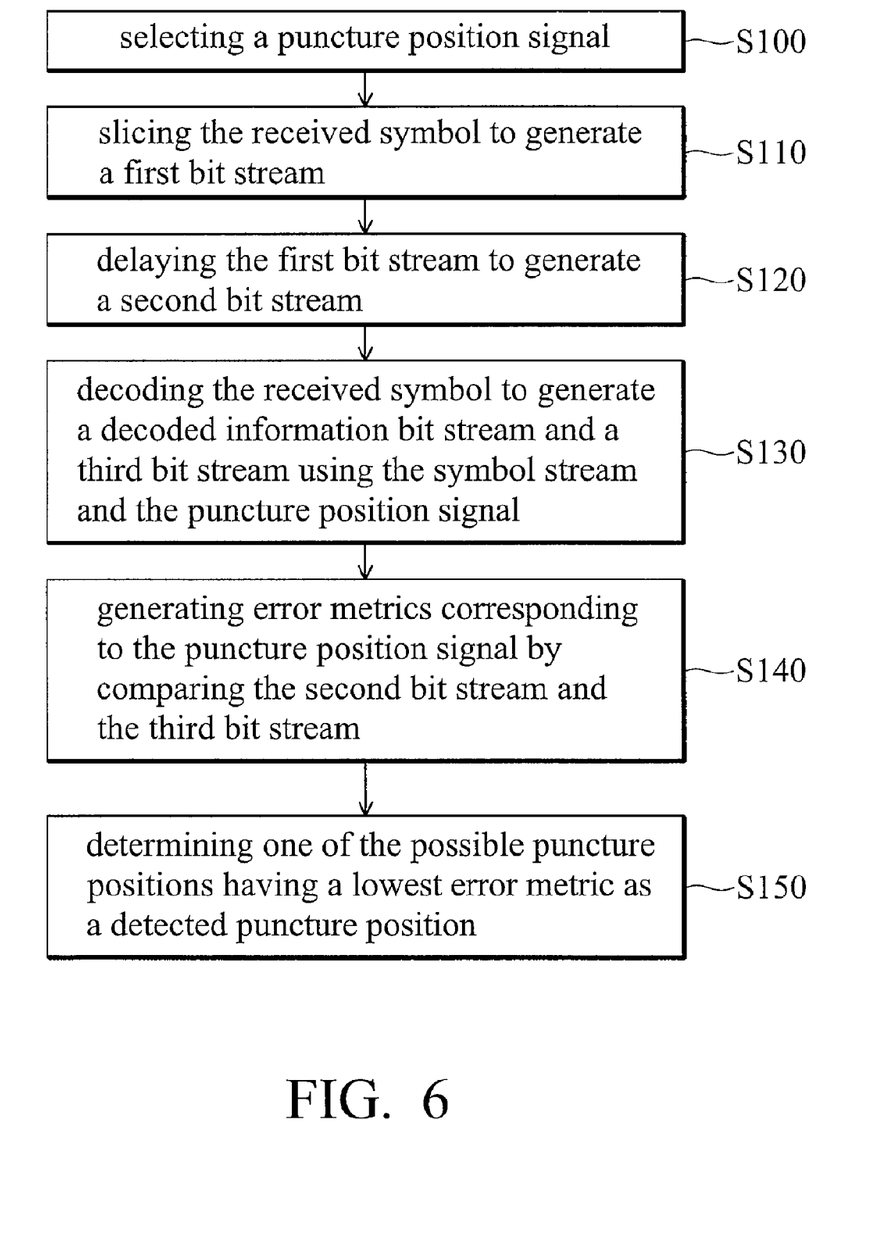
FIG. 6 is a flowchart showing detection of a puncture position for decoding a symbol stream in accordance with the preferred embodiment.

FIG. 6 is a flowchart showing determination of a puncture position of a received symbol in accordance with the preferred embodiment. First, a puncture position signal 500 is generated to indicate a puncture position, wherein the puncture position is one of possible positions (Step S100). The received symbol 300 is sliced to generate a first bit stream including a U bits stream 310 and a V bits stream 410 according to Rule-1 and Rule-2 described above (Step S110). Then the U bits stream 310 and the V bits stream 410 (first bit stream) are delayed to generate the delayed U bits stream 320 and the delayed V bits stream 420 (second bit stream) (Step S120). Conversely, the received symbol 300 is de-punctured according to the puncture position indicated by the puncture position signal, and decoded by maintaining a surviving path based on a maximum likelihood estimation; once the surviving path is found, a stream of decoded code and a decoded information bit stream 330 are also discovered according to the stream of decoded code. Representative bits of the stream of decoded code are extracted and concatenated as a decoded U bits stream and decoded V bits stream (third bit stream). (step S130). Next, the error metrics corresponding to possible puncture positions signals are calculated by comparing the delayed U and V bit streams (second bit stream) and the decoded U and V bit streams (third bit stream), respectively (Step S140). Then one of the possible puncture positions having a lowest error metric is determined as a detected puncture position (Step S150).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for determining a detected puncture position for a de-puncturing process, the apparatus comprising:
   a slicing unit for slicing each of received symbols according to a hard decision rule to generate a first bit stream;
   a delay line coupled to the slicing unit for delaying the first bit stream to generate a second bit stream;
   a convolutional decoder for receiving a stream of the received symbols and performing the de-puncturing process and a decoding process to generate a third bit stream, wherein the de-puncturing process is performed according to a puncture position indicated by a puncture position signal, and the decoding process is performed according to a surviving path maintained by the convolutional decoder; and
   a puncture decision unit coupled to the delay line and the convolutional decoder, for generating the puncture position signal to indicate the puncture position, wherein the puncture position is one of possible puncture positions, and comparing the second bit stream and the third bit stream to generate an error metric corresponding to the puncture position, and then determining the detected puncture position by selecting one of the possible puncture positions according to the error metrics corresponding to possible puncture positions.

2. The apparatus of claim 1, wherein the puncture decision unit determines the detected puncture position by selecting one of the possible puncture positions corresponding to a lowest error metric.

3. The apparatus of claim 1, wherein as the detected puncture position is determined, the puncture decision unit generates the puncture position signal corresponding to the detected puncture position, and the convolutional decoder de-punctures and decodes the received symbols according to the puncture position signal corresponding to the detected puncture position and by maintaining the surviving path, and further generates a decoded information bitstream according to the surviving path.

4. The apparatus of claim 1, wherein the convolutional decoder generates a stream of decoded codes according to the surviving path, each decoded code corresponding to a constellation point of a modulation scheme of the received symbols, and extracts at least one bit of each decoded code to form the third bit stream.

5. The apparatus of claim 1, wherein the puncture decision unit comprises:
   a determiner for determining the puncture position signal;
   a comparator coupled to the delay line and the convolutional decoder, for comparing the second bit stream and the third bit stream to generate a stream of comparison results;
   a calculator for calculating the error metric, which corresponds to the puncture position indicated by the puncture position signal, based on the stream of comparison results;
   wherein the determiner generates the puncture position signal to indicate the puncture position, which is one of possible puncture positions, to the convolutional decoder and then determining the detected puncture position by selecting one of the possible puncture positions according to the error metrics corresponding to possible puncture positions.

6. The apparatus of claim 1, wherein the delay line delays the first bit stream for a time period to synchronize between the second bit stream and the third bit stream.

7. The apparatus of claim 1, wherein the hard decision rule is set according to a constellation diagram of a modulation scheme of the received symbols.

8. The apparatus of claim 7, wherein the constellation diagram includes a bit 0 region and a bit 1 region, and each of the received symbols contains a component, and a bit in the first bit stream is determined as "0" if the component lies within the bit 0 region, and determined as "1" if the component lies within the bit 1 region.

9. The apparatus of claim 1, wherein the received symbol complies with the standard of the ITU-T Recommendation J.83 Annex B.

10. The apparatus of claim 9, wherein the received symbol is a 64-QAM symbol.

11. The apparatus of claim 10, wherein the received symbol corresponds to a code of 6 bits as $C^5C^4C^3C^2C^1C^0$, and the slicing unit determines $C^0$ bit for each of the received symbols to generate the first bit stream.

12. The apparatus of claim 10, wherein the received symbol corresponds to a code of 6 bits as $C^5C^4C^3C^2C^1C^0$, and the slicing unit determines $C^0$ bit as 0 if a quadrature component of the received symbol is closer to values of −7, −3, +1, or +5 rather than values of −5, −1, +3, +7, otherwise the slicing unit determines $C^0$ bit as 1.

13. The apparatus of claim 10, wherein the received symbol corresponds to a code of 6 bits as $C^5C^4C^3C^2C^1C^0$, and the slicing unit determines $C^3$ bit for each of the received symbols to generate the first bit stream.

14. The apparatus of claim 10, wherein the received symbol corresponds to a code of 6 bits as $C^5C^4C^3C^2C^1C^0$, and the slicing unit determines $C^0$ bit and $C^3$ bit for each of the received symbols to generate the first bit stream.

15. The apparatus of claim 10, wherein the received symbol corresponds to a code of 6 bits as $C^5C^4C^3C^2C^1C^0$, and the slicing unit determines $C^3$ bit as 0 if an in-phase component of the received symbol is closer to values of −7, −3, +1, or +5 rather than values of −5, −1, +3, +7, otherwise the slicing unit determines $C^3$ bit as 1.

16. The apparatus of claim 9, wherein the received symbol is a 256-QAM symbol.

17. The apparatus of claim 16, wherein the received symbol corresponds to a code of 8 bits as $C^7C^6C^5C^4C^3C^2C^1C^0$, and the slicing unit determines $C^0$ bit for each of the received symbols to generate the first bit stream.

18. The apparatus of claim 16, wherein the received symbol corresponds to a code of 8 bits as $C^7C^6C^5C^4C^3C^2C^1C^0$, and the slicing unit determines $C^0$ bit as 0 if a quadrature component of the received symbol is closer to values of −15, −11, −7, −3, +1, +5, +9, +13 rather than values of −13, −9, −5, −1, +3, +7, +11, +15, otherwise the slicing unit determines $C^0$ bit as 1.

19. The apparatus of claim 16, wherein a second decoded code associated with each of the received symbols contains 8 bits as $C^7C^6C^5C^4C^3C^2C^1C^0$, and the slicing unit determines $C^4$ bit for each of the received symbols to generate the first bit stream.

20. The apparatus of claim 16, wherein the received symbol corresponds to a code of 8 bits as $C^7C^6C^5C^4C^3C^2C^1C^0$, and the slicing unit determines $C^4$ bit as 0 if an in-phase component of the received symbol is closer to values of −15, −11, −7, −3, +1, +5, +9, +13 rather than values of −13, −9, −5, −1, +3, +7, +11, +15, otherwise the slicing unit determines $C^4$ bit as 1.

21. The apparatus of claim 16, wherein the received symbol corresponds to a code of 8 bits as $C^7C^6C^5C^4C^3C^2C^1C^0$, and the slicing unit determines $C^0$ bit and $C^4$ bit for each of the received symbols to generate the first bit stream.

22. The apparatus of claim 1, wherein the convolutional decoder is a Viterbi decoder.

23. A method for determining a detected puncture position for a de-puncturing process, the method comprising:
generating a puncture position signal to indicate a puncture position, wherein the puncture position is one of possible puncture positions;
slicing each of received symbols according to a hard decision rule to generate a first bit stream;
delaying the first bit stream to generate a second bit stream;
receiving a stream of the received symbols and performing the de-puncturing process and a decoding process to generate a third bit stream, wherein the de-puncturing process is performed according to the puncture position indicated by the puncture position signal, and the decoding process is performed by maintaining a surviving path according to a convolutional decoding;
comparing the second bit stream and the third bit stream to generate an error metric corresponding to the puncture position; and
determining the detected puncture position by selecting one of the possible puncture positions according to the error metrics corresponding to possible puncture positions.

24. The method of claim 23, wherein the step of determining the detected puncture position is performed by selecting one of the possible puncture positions corresponding to a lowest error metric.

25. The method of claim 23, wherein the method further comprises generating the puncture position signal corresponding to the detected puncture position, and de-puncturing and decoding the received symbols according to the puncture position signal corresponding to the detected puncture position and by maintaining the surviving path, and generating a decoded information bitstream according to the surviving path.

26. The method of claim 23, wherein the decoding process comprises generating a stream of decoded code according to the surviving path, each decoded code corresponding to a constellation point of a modulation scheme of the received symbols, and extracting at least one bit of each decoded code to form the third bit stream.

27. The method of claim 23, wherein the step of determining the detected puncture position comprises:
comparing the second bit stream and the third bit stream to generate a comparison result;
calculating the error metric based on the comparison result; and
determining the detected puncture position by selecting one of the possible puncture positions according to the error metrics corresponding to possible puncture positions.

28. The method of claim 23, wherein the step of delaying the first bit stream is to synchronize between the second bit stream and the third bit stream.

29. The method of claim 23, wherein the hard decision rule is set according to a constellation diagram of a modulation scheme of the received symbols.

30. The method of claim 23, wherein the constellation diagram includes a bit 0 region and a bit 1 region, and the received symbol contains a component, and a bit in the first bit stream is determined as "0" if the component lies within the bit 0 region, and determined as "1" if the component lies within the bit 1 region.

31. The method of claim 23, wherein the received symbol complies with the standard of the ITU-T Recommendation J.83 Annex B.

32. The method of claim 31, wherein the received symbol is a 64-QAM symbol.

33. The method of claim 32, wherein the received symbol corresponds to a code of 6 bits as $C^5C^4C^3C^2C^1C^0$, and the step of slicing each of the received symbols determines $C^0$ bit for each of the received symbol to generate the first bit stream.

34. The method of claim 32, wherein the received symbol corresponds to a code of 6 bits as $C^5C^4C^3C^2C^1C^0$, and the step of slicing each of the received symbols determines $C^0$ bit as 0 if a quadrature component of the received symbol is closer to values of −7, −3, +1, or +5 rather than values of −5, −1, +3, +7, otherwise determines $C^0$ bit as 1.

35. The method of claim 32, wherein the received symbol corresponds to a code containing 6 bits as $C^5C^4C^3C^2C^1C^0$, and the step of slicing each of the received symbols determines $C^3$ bit for each of the received symbols to generate the first bit stream.

36. The method of claim 32, wherein the received symbol corresponds to a code of 6 bits as $C^5C^4C^3C^2C^1C^0$, and the step of slicing each of the received symbols determines $C^0$ bit and $C^3$ bit for each of the received symbols to generate the first bit stream.

37. The method of claim 32, wherein the received symbol corresponds to a code of 6 bits as $C^5C^4C^3C^2C^1C^0$, and the step of slicing each of the received symbols determines $C^3$ bit as 0 if an in-phase component of the received symbol is closer to values of −7, −3, +1, or +5 rather than values of −5, −1, +3, +7, otherwise determines $C^3$ bit as 1.

38. The method of claim 31, wherein the received symbol is a 256-QAM symbol.

39. The method of claim 38, wherein the received symbol corresponds to a code of 8 bits as $C^7C^6C^5C^4C^3C^2C^1C^0$, and the step of slicing each of the received symbols determines $C^0$ bit for each of the received symbols to generate the first bit stream.

40. The method of claim 38, wherein the received symbol corresponds to a code of 8 bits as $C^7C^6C^5C^4C^3C^2C^1C^0$ and the step of slicing each of the received symbols determines $C^0$ bit as 0 if a quadrature component of the received symbol is closer to values of −15, −11, −7, −3, +1, +5, +9, +13 rather than values of −13, −9, −5, −1, +3, +7, +11, +15, otherwise determines $C^0$ bit as 1.

41. The method of claim 38, wherein the received symbol corresponds to a code of 8 bits as $C^7C^6C^5C^4C^3C^2C^1C^0$, and the step of slicing each of the received symbols determines $C^4$ bit for each of the received symbols to generate the first bit stream.

42. The method of claim 38, wherein the received symbol corresponds to a code of 8 bits as $C^7C^6C^5C^4C^3C^2C^1C^0$, and the step of slicing each of the received symbols determines $C^4$ bit as 0 if an in-phase component of the received symbol is closer to values of −15, −11, −7, −3, +1, +5, +9, +13 rather than values of −13, −9, −5, −1, +3, +7, +11, +15 otherwise determines $C^4$ bit as 1.

43. The method of claim 38, wherein the received symbol corresponds to a code of 8 bits as $C^7C^6C^5C^4C^3C^2C^1C^0$, and the step of slicing each of the received symbols determines $C^0$ bit and $C^4$ bit for each of the received symbols to generate the first bit stream.

44. The method of claim 23, wherein decoding the received symbol is based on Viterbi decoding.

\* \* \* \* \*